(12) United States Patent
Kim et al.

(10) Patent No.: US 6,498,534 B1
(45) Date of Patent: Dec. 24, 2002

(54) AMPLIFIER CIRCUIT FOR LINE DRIVER

(75) Inventors: Chun-Sup Kim, Cupertino, CA (US); Sang-Soo Lee, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/882,497

(22) Filed: Jun. 15, 2001

(51) Int. Cl.[7] .............................................. H03G 3/20
(52) U.S. Cl. ................................... 330/136; 330/124 R
(58) Field of Search ............................. 330/51, 124 R, 330/129, 136, 295

(56) References Cited

U.S. PATENT DOCUMENTS

| | | | | |
|---|---|---|---|---|
| 4,439,740 A | * | 3/1984 | Harrington | 330/124 R |
| 5,017,886 A | * | 5/1991 | Geller | 330/277 |
| 5,729,174 A | * | 3/1998 | Dunnebacke et al. | 330/51 |

OTHER PUBLICATIONS

Casier et al., "A 3.3–V, Low–Distortion ISDN Line Driver with a Novel Quiescent Current Control Circuit", Jul. 1998, IEEE Journal of Solid–State Circuits, vol. 33, No. 7, pp. 1130–1133.

Khorramabadi et al., A Highly Efficient CMOS Line Driver with 80–dB Linearity for ISDN U–Interface Applications:, Dec. 1992, IEEE Journal of Solid–State Circuits, vol. 27, No. 12, pp. 1723–1729.

* cited by examiner

*Primary Examiner*—Benny Lee
*Assistant Examiner*—Henry Choe
(74) *Attorney, Agent, or Firm*—Thelen Reid & Priest LLP (57) ABSTRACT

A variable-gain amplifier circuit includes an input port, an output port, and first and second amplifiers coupled therebetween. The first amplifier includes a first amplifier path having a first amplification factor, effective when the input signal has a voltage level in a first range, and a second amplifier path having a second amplification factor greater than the first amplification factor, effective when the input signal has a voltage level in a second range including voltages of a first polarity greater than that in the first range. The second amplifier includes a third amplifier path having the first amplification factor, effective when the input signal has a voltage level in a third range, and a fourth amplifier path having the second amplification factor, effective when the input signal has a voltage level in a fourth range including voltages of a second polarity greater than that in the third range.

40 Claims, 6 Drawing Sheets

$$A_{V1} = \frac{g_{M1}}{g_{M8} \text{ in series with } g_{M7}} \approx 10$$

FIG._4A

$$A_{V2} = \frac{g_{M1}}{g_{ds6} \mathbin{/\mkern-6mu/} g_{ds4} \mathbin{/\mkern-6mu/} g_{ds2}} \approx 100$$

FIG._7 and adjust the offset using a quiescent control circuit in negative feedback configuration. This approach has been used in Integrated Services Digital Network (ISDN) applications with moderate linearity level. However, complex hardware is required to realize the quiescent current control circuit.

Accordingly, it would be desirable to reduce the quiescent current variation due to amplifier offset while maintaining a sufficient bandwidth and good linearity of the overall amplifier without adding a complex control circuit.

AMPLIFIER CIRCUIT FOR LINE DRIVER

FIELD OF THE INVENTION

The present invention relates to broadband telecommunications. More particularly, the present invention relates to a Class-AB amplifier for a line driver in a broadband telecommunications system.

BACKGROUND OF THE INVENTION

Figure 1:
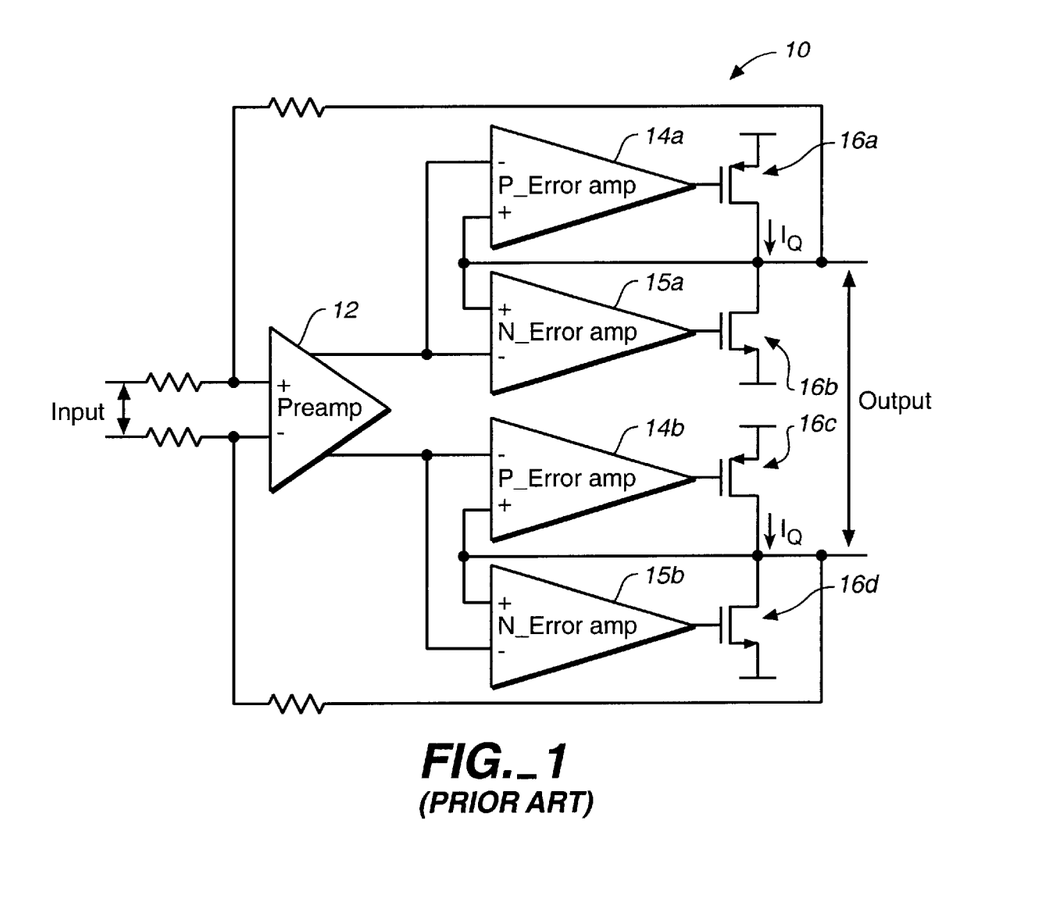
FIG. 1 is an electrical schematic diagram illustrating a typical circuit structure of a Class-AB amplifier.

FIG. 1 illustrates a typical circuit structure of a Class-AB amplifier 10, including a pre-amplifier (pre-amp) 12, error amplifiers 14 (14a, 14b) and 15 (15a, 15b), and large-sized output devices 16 (16a–16d) in a closed loop configuration. An input signal is amplified through these three stages. Because of the push-pull nature of the Class-AB amplifier structure, both N-type error amplifiers 14 and P-type error amplifiers 15 are required. In order to achieve a required linearity level of the amplifier for a specific application, typically the open loop gain of the amplifier 10 has to be maximized while maintaining stability. To realize a large open loop gain, the gain of each amplifier stage in the signal path, i.e., the pre-amp gain, the error amplifier gain, and the gain from the output devices, should be maximized as much as possible.

However, the gain of an error amplifier cannot be made arbitrarily large because of offset of the error amplifier, which largely depends on the matching of transistors in the error amplifier. The offset of the error amplifier is statistical in nature and considered random, and varies over process and temperature. Such a random offset of the error amplifier causes a random variation in an offset voltage. Since a quiescent current variation ($\Delta I_Q/I_Q$) is proportional to the offset voltage ($\Delta V$) and the gain ($A_v$) of the amplifier, a large gain of the amplifier causes a large quiescent current variation, which results in excess power dissipation and/or degraded linearity of the overall amplifier.

The quiescent current is basically the operating supply current of the amplifiers, and is required to bias the internal circuitry (such as output devices) of the amplifiers. Since the quiescent current must be always be supplied whether there is signal applied or not, it adds to the power consumption and power dissipation of the amplifier. Designing for very low quiescent current significantly reduces the power dissipation. However, on the other hand, in order to obtain a low distortion and/or high linearity performance of the amplifier, an additional biasing current (i.e., a larger quiescent current) is typically required for the internal circuitry. In such a case, a large fluctuation in the quiescent current also degrades the linearity of the amplifier.

There are two conventional approaches to solve the offset problem of the error amplifier. A widely adopted approach is to limit the gain of the error amplifier (typically an amplification factor of less than 10) to reduce the quiescent current variation due to a random offset. This approach is effective when the signal bandwidth is low and/or the required linearity level of the amplifier is not high. However, simply limiting the error amplifier gain is not an acceptable solution in the applications where the bandwidth and linearity requirements are more demanding, for example, in broadband communications. In broadband communications, the linearity or signal to noise ratio (SNR) of the amplifier dictates the achievable data rate between a transmitter and a receiver.

The other approach to solve the offset problem of the error amplifier is to monitor the quiescent current of the amplifier

BRIEF DESCRIPTION OF THE INVENTION

An amplifier circuit having a variable output gain includes an input port for receiving an input signal, an output port for supplying an output signal, a first amplifier coupled between the input port and the output port, and a second amplifier coupled between the input port and the output port. The first amplifier includes a first amplifier path having a first amplification factor, effective when the input signal has a voltage level in a first voltage range, and a second amplifier path having a second amplification factor greater than the first amplification factor, effective when the input signal has a voltage level in a second voltage range, the second voltage range including voltages of a first polarity greater than that in the first voltage range. The second amplifier includes a third amplifier path having the first amplification factor, effective when the input signal has a voltage level in a third voltage range, and a fourth amplifier path having the second amplification factor, effective when the input signal has a voltage level in a fourth voltage range, the fourth voltage range including voltages of a second polarity greater than that in the third voltage range.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an amplifier circuit for a line driver. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 2:
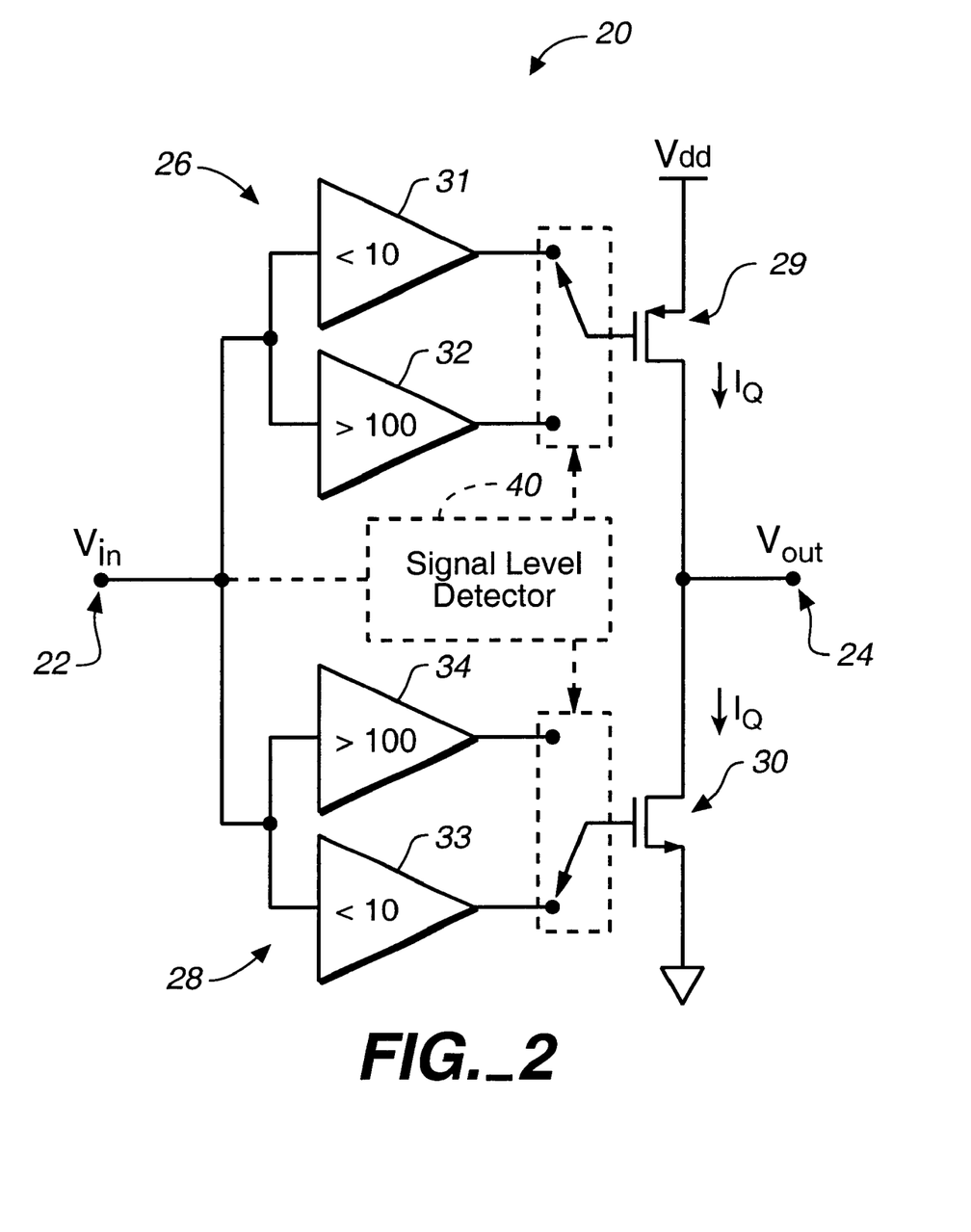
FIG. 2 is an electrical schematic diagram illustrating an amplifier circuit having a variable output gain in accordance with an embodiment of the present invention.

FIG. 2 schematically illustrates an amplifier circuit 20 having a variable output gain in accordance with the present invention. The present invention provides a low/high mixed-gain error amplifier structure to be used in Class-AB amplifiers, for example, Class-AB line drivers for broadband communications. As shown in FIG. 2, the amplifier circuit 20 includes an input port 22 for receiving an input signal $V_{in}$, an output port 24 for supplying an output signal $V_{out}$, a first amplifier 26 coupled between the input port 22 and the output port 24, and a second amplifier 28 coupled between the input port 22 and the output port 24. The amplifier circuit 20 also includes a first output device 29 for the first amplifier 26 and a second output device 30 for the second amplifier 28.

Because of a push-pull nature of the Class-AB amplifier structure, both N-type and P-type error amplifiers are required. The first amplifier 26 may be a P-type error amplifier, and the second amplifier 28 may be an N-type error amplifier. It should be noted that FIG. 2 illustrates the amplifier circuit 20 with a single-ended structure for simplicity, however, the present invention is equally applicable for a differential structure such as one shown in FIG. 1.

As shown in FIG. 2, the first amplifier 26 includes a first amplifier path (low-gain amplifier path) 31 having a first amplification factor $A_{V1}$, and a second amplifier path (high-gain amplifier path) 32 having a second amplification factor $A_{V2}$ greater than the first amplification factor $A_{V1}$. Similarly, the second amplifier 28 includes a low-gain amplifier path 33 having the first amplification factor $A_{V1}$, and a high-gain amplifier path 34 having the second amplification factor $A_{V2}$. For example, the first amplification factor $A_{V1}$ is about 10 or less, and the second amplification factor $A_{V2}$ is about 100 or more. However, these amplification factors $A_{V1}$ and $A_{V2}$ are not limited to the specific numbers but may vary depending on an actual implementation of the amplifier circuit 20.

As shown in FIG. 2, the amplifier circuit 20 also includes an input signal level detector 40 to employ two distinct amplifier gains depending upon the input signal range. When the input signal is small, the input signal level detector 40 selects a small-gain amplifier structure (the low-gain amplifier paths 31 and 33) so as to achieve low quiescent current variation due to a random offset. When the input signal is large, on the other hand, the input level detector 40 switches the signal path to a high-gain amplifier structure (the high-gain amplifier paths 32 and 34) so as to achieve a high linearity. It should be noted that although FIG. 2 conceptually depicts the input signal detector 40 with switches, the transition between the two gain structures is gradual and no digital switching is involved. A small input signal automatically activates the low-gain amplifier paths 31 and 33 via the input signal level detector 40, and a large input signal automatically activates the high-gain amplifier paths 32 and 34 via the input signal level detector 40.

Figure 3A:
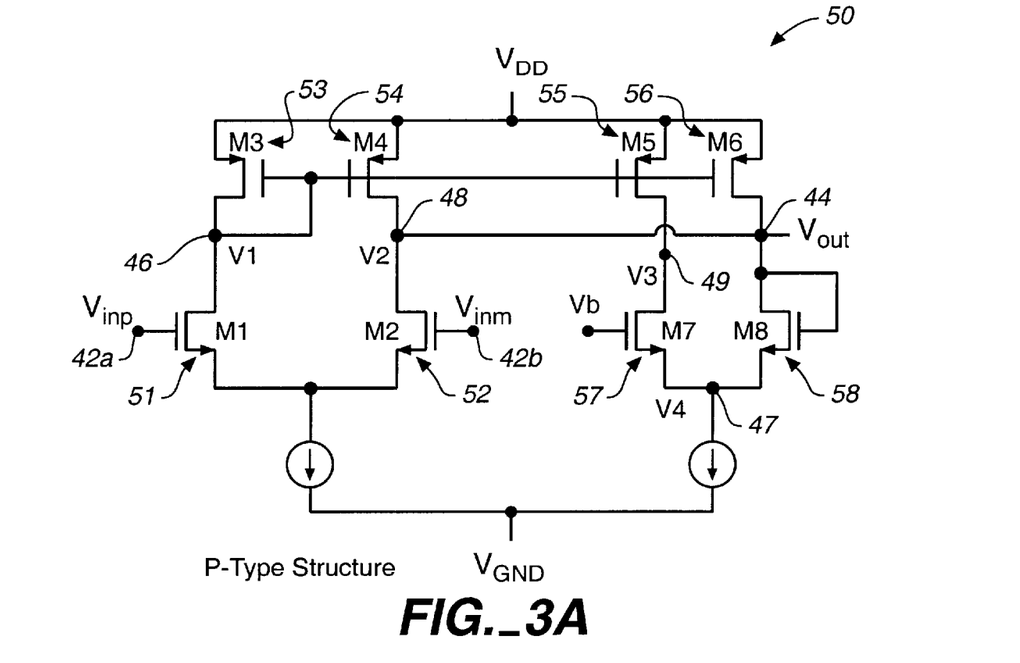
FIG. 3A is an electrical schematic diagram illustrating an amplifier circuit (P-type error amplifier structure) in accordance with a specific embodiment of the present invention.
Figure 3B:
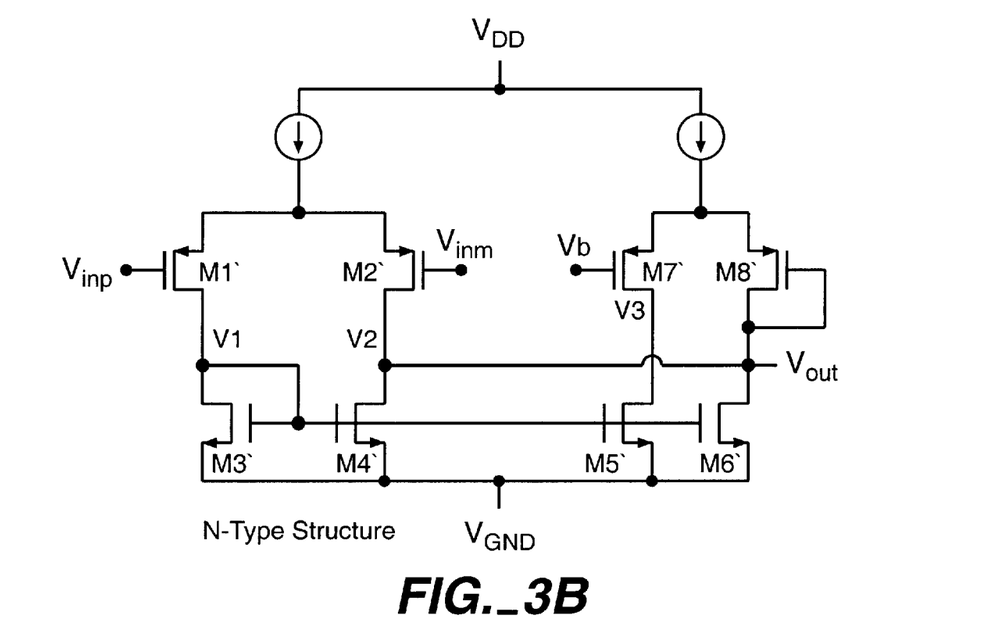
FIG. 3B is an electrical schematic diagram illustrating an amplifier circuit (N-type error amplifier structure) in accordance with a specific embodiment of the present invention.

FIG. 3A illustrates a circuit implementation of a variable-gain amplifier circuit 50 in accordance with a specific embodiment of the present invention. FIG. 3A only shows a P-type error amplifier structure of the amplifier circuit 50, for example, a circuit structure corresponding to the first amplifier 26 shown in FIG. 2. An N-type error amplifier structure corresponding to the second amplifier 28 shown in FIG. 2 is obtained by replacing all the P-type metal oxide semiconductor field effect transistors (PMOS devices) with N-type metal oxide semiconductor field effect transistors (NMOS devices), and all the NMOS devices with PMOS devices, as shown in FIG. 3B.

As shown in FIG. 3A, the amplifier circuit 50 includes a first input terminal 42a and a second input terminal 42b, an output terminal 44, a first supply voltage ($V_{DD}$), a second supply voltage ($V_{GND}$), a first N-type metal oxide semiconductor field effect transistor (NMOS) 51 (transistor M1), a second NMOS 52 (transistor M2), a first P-type metal oxide semiconductor field effect transistor (PMOS) 53 (transistor M3), a second PMOS 54 (transistor M4), a third PMOS 55 (transistor M5), a fourth PMOS 56 (transistor M6), a third NMOS 57 (transistor M7), a fourth NMOS 58 (transistor M8), a first node 46, a second node 48, and a third node 49.

The gate of the first NMOS 51 is coupled to the first input terminal 42a, the source of the first NMOS 51 is coupled to the second supply voltage ($V_{GND}$), and the drain of the first NMOS 51 is coupled to the first node 46. The gate of the second NMOS 52 is coupled to the second input terminal 42b, the source of the second NMOS 52 is coupled to the second supply voltage ($V_{GND}$), and the drain of the second NMOS 52 is coupled via the second node 48 to the output terminal 44.

The gate and drain of the first PMOS 53 are coupled to the first node 46, and the source of the first PMOS 53 is coupled to the first supply voltage ($V_{DD}$). The gate of the second PMOS 54 is coupled to the first node 46, the source of the second PMOS 54 is coupled to the first supply voltage ($V_{DD}$), and the drain of the second PMOS 54 is coupled via the second node 48 to the output terminal 44. The gate of the third PMOS 55 is couple to the first node 46, the source of the third PMOS 55 is coupled to the first supply voltage ($V_{DD}$), and the drain of the third PMOS 55 is coupled to the third node 49. The gate of the fourth PMOS 56 is coupled to the first node 46, the source of the fourth PMOS 56 is coupled to the first supply voltage ($V_{DD}$), and the drain of the fourth PMOS 56 coupled to the output terminal 44.

The gate of the third NMOS 57 is coupled to a balance voltage ($V_b$), which approximates the input voltage $V_{inp}$, the drain of the third NMOS 57 is coupled to the third node 49, and the source of the third NMOS 57 is coupled to the second supply voltage ($V_{GND}$). The gate and drain of the fourth NMOS 58 are coupled to the output terminal 44, and the source of the fourth NMOS 58 is coupled to the second supply voltage ($V_{GND}$).

The operation of the amplifier circuit 50 is described referring to its P-type structure shown in FIG. 3A. When there is no input signal, the amplifier circuit 50 balances itself and the current from the first supply voltage ($V_{DD}$) to the second supply voltage ($V_{GND}$) is equally split. Thus a voltage $V_1$ at the first node 46, a voltage $V_2$ at the second node 48, a voltage $V_3$ at the third node 49, and an output voltage $V_{out}$ are the same. The voltage $V_3$ at the third node 49 is in an equilibrium state and the transistor M7 (NMOS 57) is in saturation.

Figure 4A:
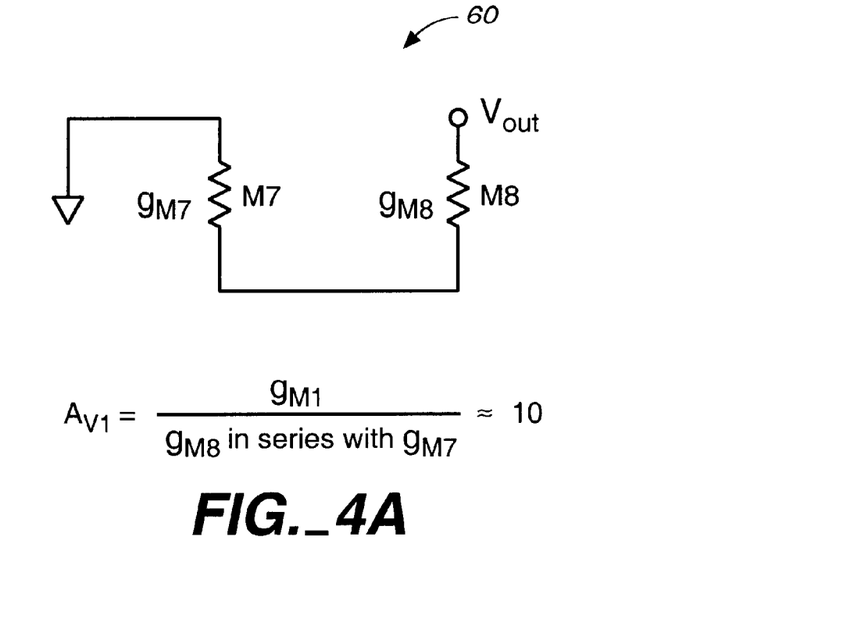
FIG. 4A is a diagram schematically illustrating a low-gain amplifier path effective for a small input signal in accordance with a specific embodiment of the present invention.

When the input signal ($V_{inm}-V_{inp}$) is small, the amplifier circuit 50 also balances itself in accordance with the small signal model. That is, the current from the first supply voltage ($V_{DD}$) to the second supply voltage ($V_{GND}$) is still equally split, and thus a voltage $V_1$ at the first node 46, a voltage $V_2$ at the second node 48, a voltage $V_3$ at the third node 49, and an output voltage $V_{out}$ should be the same. Thus, the voltage $V_3$ at the third node 49 becomes close to its equilibrium and the transistor M7 (NMOS 57) is forced to be in saturation. Therefore, effectively, the two transistors M7 (NMOS 57) and M8 (NMOS 58) are coupled in series to the output terminal 44, forming a low-gain amplifier path 60, as shown in FIG. 4A. The output impedance is low because $g_{m7}$ and $g_{m8}$ are in series.

It should be noted that in the amplifier path, a gain contribution from the conductance $g_{ds5}$ of the transistor M5 (PMOS 55) and a gain contribution from the conductance $g_{ds7}$ of the transistor M7 (PMOS 57) can be neglected compared with that from the transconductances $g_{m7}$ and $g_{m8}$ of the transistors M7 and M8, since the transconductance of a transistor is typically significantly greater than the conductance (for example, by a factor about 10 or more).

Accordingly, the amplification factor (gain) $A_{V1}$ is substantially determined by transconductances of the transistors M8 and M7 coupled in series to the output port, and is approximated as:

$$A_{V1} = \frac{g_{m1}}{g_{m8} \text{ in series with } g_{m7}} \quad (1)$$
$$= g_{m1}\left(\frac{g_{m7}+g_{m8}}{g_{m8} \cdot g_{m7}}\right)$$

where $g_{m1}$ is a transconductance of the transistor M1(NMOS 51), $g_{m8}$ is a transconductance of the transistor M7 (NMOS 57), and $g_{m8}$ is a transconductance of the transistor M8 (NMOS 58). It should be noted that the transconductance $g_m$ of a transistor in saturation is significantly greater than its drain-source conductance $g_{ds}$, and thus the resistance of the transistor is approximated by $1/g_m$. By choosing an appropriate device ratio of the transistors, the amplification factor for a small signal may be set to be about 10 or less. This makes the error amplifier gain small when the input signal is small, reducing the quiescent current variation due to offset of the amplifier.

Figure 4B:
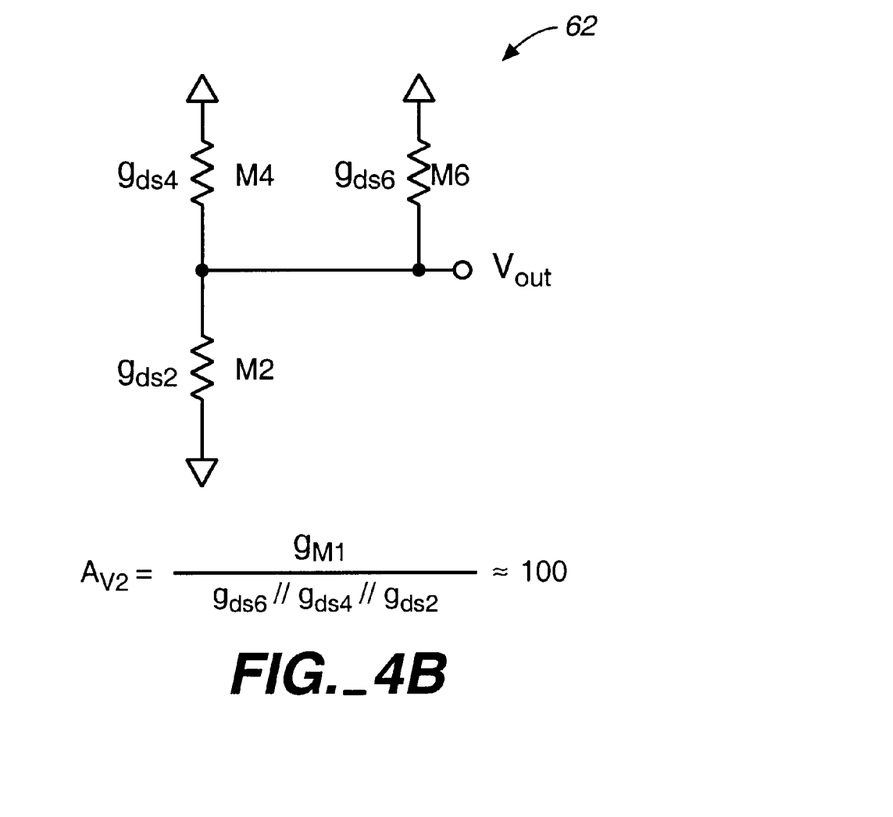
FIG. 4B is a diagram schematically illustrating a high-gain amplifier path effective for a large input signal in accordance with a specific embodiment of the present invention.

When the input signal ($V_{inm}-V_{inp}$) is large, on the other hand, the transistor M5 (PMOS 55) is in strong inversion, and the transistor M7 (NMOS 57) is pushed into a triode region and operates as a switch. That is, referring back to FIG. 3A, the impedance looking up from the third node 49 is high, and the impedance looking down from a node 47 is also high, and the "$g_m$ impedance path" through M8 and M7 is effectively dropped out from the circuit. Since there is no diode impedance in the effective signal path, the output impedance becomes high. FIG. 4B schematically illustrates a high-gain amplifier path 62 effective for a large input signal. As shown in FIG. 4B, the high-gain amplifier path 62 includes drain-source conductacnes of M6 (PMOS 56), M4 (PMOS 54), and M2 (NMOS 52) coupled in parallel to the output port.

Accordingly, the amplifier factor $A_{V2}$ is substantially determined by these drain-source conductances coupled in parallel, and given as:

$$A2 = \frac{g_{m1}}{g_{ds6} \mathbin{/\mkern-5mu/} g_{ds4} \mathbin{/\mkern-5mu/} g_{ds2}} \quad (2)$$

where $g_{ds2}$, $g_{ds4}$, and $g_{ds6}$ are the drain-source conductances of the transistors M2, M4, and M6, respectively, and $$g_1 \mathbin{/\mkern-5mu/} g_2 \equiv \frac{g_1 \cdot g_2}{g_1 + g_2}.$$

By choosing an appropriate device ratio for the transistors, the amplification factor for a large signal may be set to be about 100 or more. This makes the error amplifier gain high when the input signal is large, providing effective amplification.

Although the detailed structure and operation of the amplifier circuit 50 have been described referring to the P-type structure shown in FIG. 3A, such detailed structure and operation of the N-type amplifier structure shown in FIG. 3B are similarly understood by those of ordinary skill in the art without further explanation. Due to its P-type structure, the above-described operation of the amplifier circuit 50 primarily contributes to amplifying an input signal ($V_{inp}-V_{inm}$) having a voltage below a reference voltage level ($V_{ref}$) or having a first ("negative") polarity, while the N-type structure shown in FIG. 3B primarily amplifies an input signal ($V_{inp}-V_{inm}$) having a voltage above the reference voltage level ($V_{ref}$) or having a second ("positive") polarity.

Figure 5:
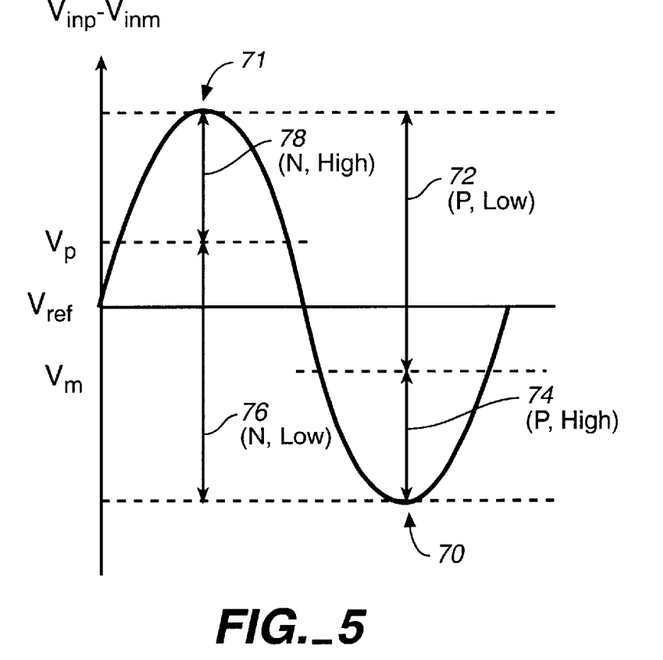
FIG. 5 is a diagram schematically illustrating a relationship between the voltage level of an input signal and effective amplifier paths in the P-type and N-type error amplifiers in accordance with a specific embodiment of the present invention.

FIG. 5 schematically illustrates a relationship between the voltage level of the input signal and effective amplifier paths in P-type and N-type error amplifier structures. The input signal having a voltage level below the reference voltage $V_{ref}$ is referred to as having a negative polarity, as indicated by a curve 70 in FIG. 5. The input signal having a voltage level above the reference voltage $V_{ref}$ is referred to as having a positive polarity, as indicated by a curve 71 in FIG. 5.

When the input signal has the negative polarity and a voltage smaller than a certain value $V_m$, the low-gain amplifier path 60 (FIG. 4A) is in effect and the input signal is amplified with a low gain, as descried above. The value $V_m$ is determined by the device ratio of the transistors. As is understood from the P-type error amplifier structure (FIG. 3A), the low-gain amplifier path remains effective for an input signal having a voltage above the reference level $V_{ref}$, i.e., the input signal having the positive polarity. Accordingly, the P-type low-gain amplifier path is effective for an input signal of a first range 72, as shown in FIG. 5. On the other hand, when the input signal has the negative polarity and a voltage greater than the value $V_m$, the high-gain amplifier path 62 (FIG. 4B) is in effect and the input signal is amplified with a high gain, as described above. That is, the P-type high-gain amplifier path is effective for an input signal of a second range 74, as indicated in FIG. 5.

Similarly, when the input signal has the positive polarity and a voltage smaller than a certain value $V_p$, the low-gain amplifier path in the N-type amplifier structure is in effect and the input signal is amplified with a low gain. The value $V_p$ is determined by the device ratio of the transistors. The value $V_p-V_{ref}$ may be equal to the value $V_{ref}-V_m$ to make the P-type and N-type structures symmetric. As is understood from the N-type error amplifier structure (FIG. 3B), the low-gain amplifier path remains effective for an input signal having a voltage below the reference level $V_{ref}$, i.e., the input signal having the negative polarity. Accordingly, the N-type low-gain amplifier path is effective for an input signal of a third range 76, as shown in FIG. 5. On the other hand, when the input signal has the positive polarity and a voltage greater than the value $V_p$, the high-gain amplifier in the N-type amplifier structure is in effect and the input signal is amplified with a high gain. That is, the N-type high-gain amplifier path is effective for an input signal of a fourth range 78, as indicated in FIG. 5.

Figure 6:
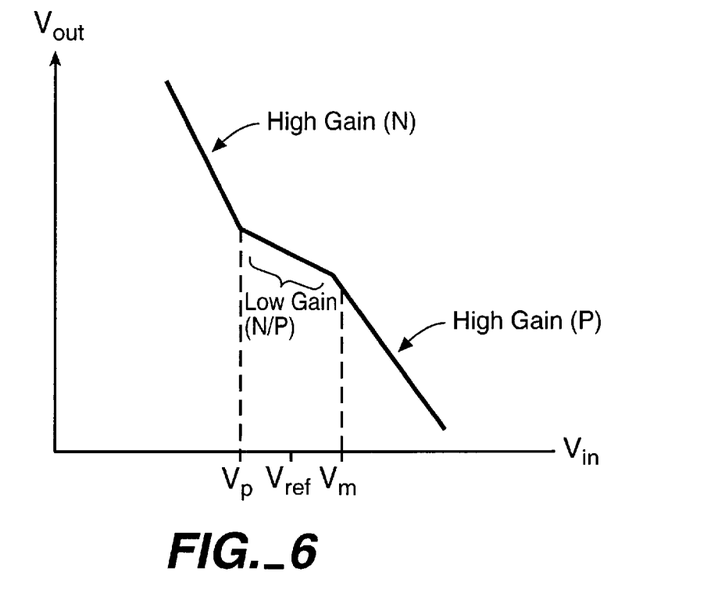
FIG. 6 is a diagram schematically illustrating an output voltage $V_{out}$ amplified by the variable-gain amplifier in accordance with a specific embodiment of the present invention.

Accordingly, a large input signal with a negative polarity is effectively amplified with a high-gain path of the P-type amplifier structure, while the N-type amplifier structure remains with a low output gain. When an input signal is large and has the positive polarity, the input signal is effectively amplified via a high-gain path of the N-type amplifier structure, while the P-type amplifier structure remains with a low output gain. Thus, a large input signal of either polarity is amplified with a high gain, achieving a good linearity of the overall amplifier. In case of a small input signal of either negative or positive polarity, the low-gain amplifier path is effective in the both P-type and N-type amplifier structures, and thus the output gain is low, reducing the quiescent current variation due to the offset of the error amplifiers. FIG. 6 schematically illustrates a resulting output voltage $V_{out}$ amplified by the variable gain amplifier in accordance with the present invention.

As is understood from the circuit operation described above, the transition from the low-gain amplifier path to the high-gain amplifier path is gradual, and depends only on the device ratio. There is no external signal detector circuitry, and the signal level detector with a switching feature is implemented in the error amplifier structure itself. Referring back to FIG. 3A, the input transistors M1 (NMOS 51) and M2 (NMOS 52) operate as a signal detector, and drive transistors M4, M5, and M6 (PMOS devides 54, 55 and 56) according to the input signal voltage so as to change the operational mode of the transistor M7 (NMOS 57), which effectively switches the amplifier path. The combination of these transistors operates as a selection device for selecting a different amplifier path according to the voltage level of an input signal.

Figure 7:
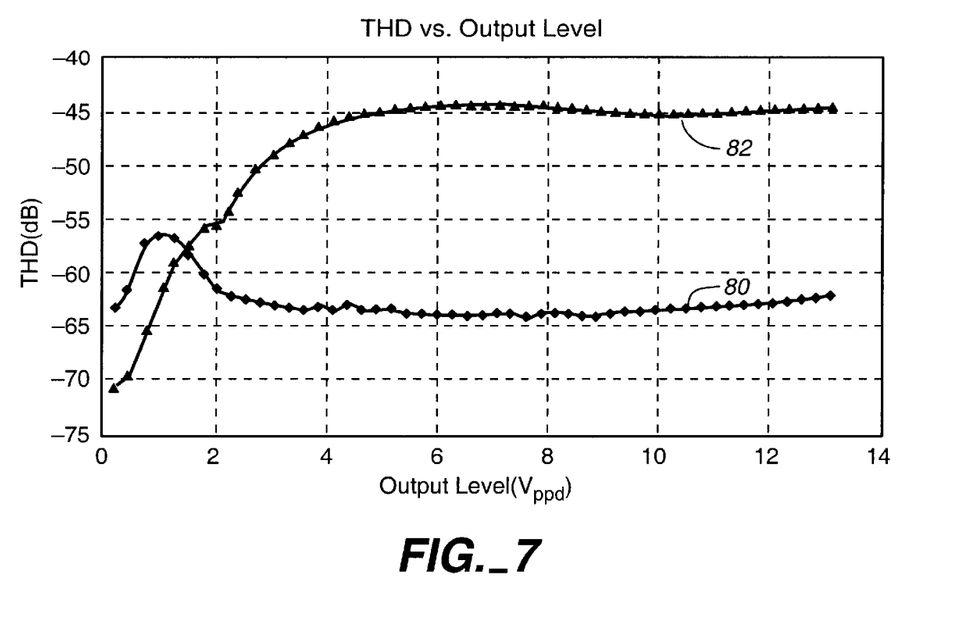
FIG. 7 is a diagram illustrating an example of simulation results for the linearity of a variable-gain amplifier in accordance with the present invention, compared with that of a conventional amplifier.

FIG. 7 illustrates an example of simulation results for the linearity of the amplifier employing the error amplifier structure in accordance with the present invention. Curve 80 shows a total harmonic distortion (THD) of the closed loop of the variable-gain amplifier circuit in accordance with the present invention. The linearity of the system mainly depends on the THD. Curve 82 shows, for comparison, the THD of a conventional amplifier such as shown in FIG. 1. As shown in FIG. 7, the present invention achieves a lower THD over the most of the output level and a higher linearity overall. In accordance with the present invention, the offset problem of the error amplifier is solved by simple and easy implementation without sacrificing the linearity of the overall Class-AB amplifier.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An amplifier circuit having a variable output gain, said amplifier circuit comprising:
    an input port for receiving an input signal;
    an output port for supplying an output signal;
    a first amplifier coupled between said input port and said output port, said first amplifier including:
        a first amplifier path having a first amplification factor, effective when said input signal has a voltage level in-a first voltage range; and
        a second amplifier path having a second amplification factor greater than said first amplification factor, effective when said input signal has a voltage level in a second voltage range, said second voltage range including voltages of a first polarity greater than that in said first voltage range; and
    a second amplifier coupled between said input port and said output port, said second amplifier including:
        a third amplifier path having said first amplification factor, effective when said input signal has a voltage level in a third voltage range; and
        a fourth amplifier path having said second amplification factor, effective when said input signal has a voltage level in a fourth voltage range, said fourth voltage range including voltages of a second polarity greater than that in said third voltage range.

2. An amplifier circuit according to claim 1, wherein
    said first voltage range includes voltages of the first polarity equal to or smaller than a first voltage value,
    said second voltage range includes voltages of the first polarity equal to or greater than said first voltage value,
    said third voltage range includes voltages of the second polarity equal to or smaller than a second voltage value, and
    said fourth voltage range includes voltages of the second polarity equal to or greater than said second voltage value.

3. An amplifier circuit according to claim 2, wherein said first voltage range further includes voltages having the second polarity, and said third voltage range further includes voltages having the first polarity.

4. An amplifier circuit according to claim 1, wherein said first amplification factor is about 10 or less.

5. An amplifier circuit according to claim 1, wherein said second amplification factor is about 100 or more.

6. An amplifier circuit according to claim 1, wherein said first amplifier path includes transistors, and said first amplification factor is substantially determined by transconductances of said transistors coupled in series to said output port.

7. An amplifier circuit according to claim 1, wherein said second amplifier path includes transistors, and said second amplification factor is substantially determined by drain-source conductances of said transistors coupled in parallel to said output port.

8. An amplifier circuit according to claim 1, wherein said first amplifier is a P-type error amplifier and said second amplifier is an N-type error amplifier.

9. An amplifier circuit having a variable output gain, comprising:
    an input port for receiving an input signal;
    an output port for supplying an output signal;

a first amplifier coupled between said input port and said output port, said first amplifier including:
  a first amplifier path having a first amplification factor;
  a second amplifier path having a second amplification factor greater than said first amplification factor; and
  a first selection device coupled with said first amplifier path and said second amplifier path, for activating said first amplifier path when said input signal has a voltage level in a first voltage range, and for activating said second amplifier path when said input signal has a voltage level in a second voltage range, said second voltage range including voltages of a first polarity greater than that in said first voltage range; and
a second amplifier coupled between said input port and said output port, said second amplifier including:
  a third amplifier path having said first amplification factor;
  a fourth amplifier path having said second amplification factor; and
  a second selection device coupled with said third amplifier path and said fourth amplifier path, for activating said third amplifier path when said input signal has a voltage level in a third voltage range, and for activating said fourth amplifier path when said input signal has a voltage level in a fourth voltage range, said fourth voltage range including voltages of a second polarity greater than that in said third voltage range.

10. An amplifier circuit according to claim 9, wherein
said first voltage range includes voltages of the first polarity equal to or smaller than a first voltage value,
said second voltage range includes voltages of the first polarity equal to or greater than said first voltage value,
said third voltage range includes voltages of the second polarity equal to or smaller than a second voltage value, and
said fourth voltage range includes voltages of the second polarity equal to or greater than said second voltage value.

11. An amplifier circuit according to claim 10, wherein said first voltage range further includes voltages having the second polarity, and said third voltage range further includes voltages having the first polarity.

12. An amplifier circuit according to claim 9, wherein said first amplification factor is about 10 or less.

13. An amplifier circuit according to claim 9, wherein said second amplification factor is about 100 or more.

14. An amplifier circuit according to claim 9, wherein said first amplifier path includes transistors, and said first amplification factor is substantially determined by transconductances of said transistors coupled in series to said output port.

15. An amplifier circuit according to claim 9, wherein said second amplifier path includes transistors, and said second amplification factor is substantially determined by drain-source conductances of said transistors coupled in parallel to said output port.

16. An amplifier circuit according to claim 9, wherein said first amplifier is a P-type error amplifier and said second amplifier is an N-type error amplifier.

17. A method for amplifying an input signal with a variable gain, said method comprising:
  receiving an input signal;
  amplifying said input signal via a first amplifier path having a first amplification factor, when said input signal has a voltage level in a first voltage range;
  amplifying said input signal via a second amplifier path having a second amplification factor greater than said first amplification factor, when said input signal has a voltage level in a second voltage range, said second voltage range including voltages of a first polarity greater than that in said first voltage range;
  amplifying said input signal via a third amplifier path having said first amplification factor, when said input signal has a voltage level in a third voltage range; and
  amplifying said input signal via a fourth amplifier path having said second amplification factor, when said input signal has a voltage level in a fourth voltage range, said fourth voltage range including voltages of a second polarity greater than that in said third voltage range.

18. A method according to claim 17, wherein
said first voltage range includes voltages of the first polarity equal to or smaller than a first voltage value,
said second voltage range includes voltages of the first polarity equal to or greater than said first voltage value,
said third voltage range includes voltages of the second polarity equal to or smaller than a second voltage value, and
said fourth voltage range includes voltages of the second polarity equal to or greater than said second voltage value.

19. A method according to claim 18, wherein said first voltage range further includes voltages having the second polarity, and said third voltage range further includes voltages having the first polarity.

20. A method according to claim 17, wherein said first amplification factor is about 10 or less.

21. A method according to claim 17, wherein said second amplification factor is about 100 or more.

22. A method according to claim 17, wherein said first amplifier path includes transistors, and said first amplification factor is substantially determined by transconductances of said transistors coupled in series to said output port.

23. A method according to claim 17, wherein said second amplifier path includes transistors, and said second amplification factor is substantially determined by drain-source conductances of said transistors coupled in parallel to said output port.

24. A method for amplifying an input signal with a variable gain, said input signal being input via an input port and an amplified signal being output via an output port, said method comprising:
  providing a first amplifier path between said input port and said output port, said first amplifier path having a first amplification factor;
  providing a second amplifier path between said input port and said output port, said second amplifier path having a second amplification factor greater than said first amplification factor;
  providing a third amplifier path between said input port and said output port, said third amplifier path having said first amplification factor;
  providing a fourth amplifier path between said input port and said output port, said fourth amplification path having said second amplification factor;
  receiving an input signal;
  detecting a voltage level of said input signal;
  activating said first amplifier path when said input signal has a voltage level in a first voltage range;
  activating said second amplifier path when said input signal has a voltage level in a second voltage range, said second voltage range including voltages of a first polarity greater than that in said first voltage range;

activating said third amplifier path when said input signal has a voltage level in a third voltage range;

activating said fourth amplifier path when said input signal has a voltage level in a fourth voltage range, said fourth voltage range including voltages of a second polarity greater than that in said third voltage range; and amplifying said input signal via activated amplifier paths.

25. A method according to claim 24, wherein
said first voltage range includes voltages of the first polarity equal to or smaller than a first voltage value,
said second voltage range includes voltages of the first polarity equal to or greater than said first voltage value,
said third voltage range includes voltages of the second polarity equal to or smaller than a second voltage value, and
said fourth voltage range includes voltages of the second polarity equal to or greater than said second voltage value.

26. An amplifier circuit according to claim 25, wherein said first voltage range further includes voltages having the second polarity, and said third voltage range further includes voltages having the first polarity.

27. A method according to claim 24, wherein said first amplification factor is about 10 or less.

28. A method according to claim 24, wherein said second amplification factor is about 100 or more.

29. A method according to claim 24, wherein said first amplifier path includes transistors, and said first amplification factor is substantially determined by transconductances of said transistors coupled in series to said output port.

30. A method according to claim 24, wherein said second amplifier path includes transistors, and said second amplification factor is substantially determined by drain-source conductances of said transistors coupled in parallel to said output port.

31. An apparatus for amplifying an input signal with a variable gain, said apparatus comprising:
means for receiving an input signal;
first means for amplifying said input signal by a first amplification factor, when said input signal has a voltage level in a first voltage range;
second means for amplifying said input signal by a second amplification factor greater than said first amplification factor, when said input signal has a voltage level in a second voltage range, said second voltage range including voltages of a first polarity greater than that in said first voltage range;
third means for amplifying said input signal by said first amplification factor, when said input signal has a voltage level in a third voltage range; and
fourth means for amplifying said input signal by said second amplification factor, when said input signal has a voltage level in a fourth voltage range, said fourth voltage range including voltages of a second polarity greater than that in said third voltage range.

32. An apparatus according to claim 31, wherein
said first voltage range includes voltages of the first polarity equal to or smaller than a first voltage value,
said second voltage range includes voltages of the first polarity equal to or greater than said first voltage value,
said third voltage range includes voltages of the second polarity equal to or smaller than a second voltage value, and
said fourth voltage range includes voltages of the second polarity equal to or greater than said second voltage value.

33. An apparatus according to claim 32, wherein said first voltage range further includes voltages having the second polarity, and said third voltage range further includes voltages having the first polarity.

34. An apparatus according to claim 31, wherein said first amplification factor is about 10 or less.

35. An apparatus according to claim 31, wherein said second amplification factor is about 100 or more.

36. An apparatus for amplifying an input signal with a variable gain, said apparatus comprising:
means for receiving an input signal;
means for outputting an amplified signal;
means for providing a first amplifier path between said means for receiving and said means for outputting, said first amplifier path having a first amplification factor;
means for providing a second amplifier path between said means for receiving and said means for outputting, said second amplifier path having a second amplification factor greater than said first amplification factor;
means for providing a third amplifier path between said means for receiving and said means for outputting, said third amplifier path having said first amplification factor;
means for providing a fourth amplifier path between said means for receiving and said means for outputting, said fourth amplification path having said second amplification factor;
means for detecting a voltage level of said input signal;
means for activating said first amplifier path when said input signal has a voltage level in a first voltage range;
means for activating said second amplifier path when said input signal has a voltage level in a second voltage range, said second voltage range including voltages of a first polarity greater than that in said first voltage range;
means for activating said third amplifier path when said input signal has a voltage level in a third voltage range; and
means for activating said fourth amplifier path when said input signal has a voltage level in a fourth voltage range, said fourth voltage range voltages of a second polarity greater than that in said third voltage range.

37. An apparatus according to claim 36, wherein
said first voltage range includes voltages of the first polarity equal to or smaller than a first voltage value,
said second voltage range includes voltages of the first polarity equal to or greater than said first voltage value,
said third voltage range includes voltages of the second polarity equal to or smaller than a second voltage value, and
said fourth voltage range includes voltages of the second polarity equal to or greater than said second voltage value.

38. An apparatus according to claim 37, wherein said first voltage range further includes voltages having the second polarity, and said third voltage range further includes voltages having the first polarity.

39. An apparatus according to claim 36, wherein said first amplification factor is about 10 or less.

40. An apparatus according to claim 36, wherein said second amplification factor is about 100 or more.

* * * * *